US008206895B2

(12) United States Patent
Yoneda et al.

(10) Patent No.: US 8,206,895 B2
(45) Date of Patent: Jun. 26, 2012

(54) METHOD FOR FORMING PATTERN AND METHOD FOR MANUFACTURING SEMICONDUCTOR DEVICE

(75) Inventors: Ikuo Yoneda, Yokohama (JP); Shunko Magoshi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 661 days.

(21) Appl. No.: 12/179,198

(22) Filed: Jul. 24, 2008

(65) Prior Publication Data

US 2010/0021848 A1    Jan. 28, 2010

(51) Int. Cl.
    *G03F 7/207* (2006.01)
(52) U.S. Cl. ........ 430/322; 430/323; 430/311; 430/313; 430/394
(58) Field of Classification Search ................. None
    See application file for complete search history.

(56) References Cited

U.S. PATENT DOCUMENTS

| 7,125,495 | B2 | 10/2006 | Street et al. |
| 2008/0090170 | A1 | 4/2008 | Yoneda |
| 2008/0214010 | A1 | 9/2008 | Yoneda et al. |

FOREIGN PATENT DOCUMENTS

| JP | 5-304072 | 11/1993 |
| JP | 2000-194142 | 7/2000 |
| JP | 2001-312045 | 11/2001 |
| JP | 2003-272998 | 9/2003 |
| JP | 2007-19466 | 1/2007 |

OTHER PUBLICATIONS

Notification of Reason for Refusal issued by the Japanese Patent Office on Jul. 5, 2011, for Japanese Patent Application No. 2007-084514, and English-language translation thereof.

*Primary Examiner* — Daborah Chacko Davis
(74) *Attorney, Agent, or Firm* — Finnegan, Henderson, Farabow, Garrett & Dunner, L.L.P.

(57) ABSTRACT

According to an aspect of the present invention, there is provided a method for forming a pattern including: applying a photosensitive resin onto a film on a wafer substrate; partly exposing the photosensitive resin to light and developing the photosensitive resin to form a first pattern having an opening portion; applying a photo-curable material onto the film exposed by the opening portion of the first pattern; bringing one face of an optically-transmissive template having a second pattern formed on the one face into contact with the photo-curable material, the second pattern including projections and reentrants; irradiating the photo-curable material with light; and separating the template from the photo-curable material.

5 Claims, 9 Drawing Sheets

METHOD FOR FORMING PATTERN AND METHOD FOR MANUFACTURING SEMICONDUCTOR DEVICE

BACKGROUND OF THE INVENTION

1. Field of the Intention

An aspect of the present invention relates to a method for forming a pattern and a method for manufacturing a semiconductor device.

2. Description of the Related Art

With the progress of scaling-down of semiconductor integrated circuits and increase in scale of the integration, it has been demanded to increase the accuracy of photolithography apparatus in the field of a pattern transfer technique to realize microfabrication. On this account, the cost involved in such apparatus has been increasing, which has been a disadvantage.

As a technique to form a fine pattern at low cost, the photo-nanoimprint technique has been proposed (see e.g. JP-2000-194142-A). This is a technique to transfer a resist pattern by: pressing a stamper, i.e. a template having the projection-and-reentrant pattern that corresponds to a pattern to be formed on a substrate, against a photo-curable organic material layer formed on a surface of a substrate targeted for transfer; applying rays of light through the template to cure the organic material layer in this condition; and then separating the template from the organic material layer.

The organic material layer, which serves as a resist, is applied to the targeted surface, during which the operation is controlled so that the organic material is spread reaching every nook and cranny of the projection-and-reentrant pattern on the template. In an area where the template overlaps with an edge of a substrate when the template is pressed against the substrate, it is usually difficult to keep the template in parallel with the surface of the substrate. Therefore, the organic material is not put on such area, to which no pattern is transferred.

In regard to the vicinity of the periphery of a pattern transfer area, no pattern is formed in a peripheral area of a wafer substrate, which poses problems including the following defects. The first is the abnormality in a processing form arising near the periphery of the pattern transfer area under the influence of the change in pattern coverage in an etching step after imprinting. The second is the exfoliation of a wire in a process of CMP (Chemical Mechanical Polishing) after burying the wire in position.

SUMMARY OF THE INVENTION

According to an aspect of the present invention, there is provided a method for forming a pattern including: applying a photosensitive resin onto a film on a wafer substrate; partly exposing the photosensitive resin to light and developing the photosensitive resin to form a first pattern having an opening portion; applying a photo-curable material onto the film exposed by the opening portion of the first pattern; bringing one face of an optically-transmissive template having a second pattern formed on the one face into contact with the photo-curable material, the second pattern including projections and reentrants; irradiating the photo-curable material with light; and separating the template from the photo-curable material.

According to another aspect of the present invention, there is provided a method for manufacturing a semiconductor device including: applying a photosensitive resin onto a film on a wafer substrate; partly exposing the photosensitive resin to light and developing the photosensitive resin to form a first pattern having an opening portion; applying a photo-curable material onto the film exposed by the opening portion of the first pattern; bringing one face of an optically-transmissive template having a projection-and-reentrant pattern formed on the one face into contact with the photo-curable material; irradiating the photo-curable material with light; separating the template from the photo-curable material; etching the film by using of a combination of the photosensitive resin and photo-curable material as a mask; and forming a device pattern on the wafer substrate.

BRIEF DESCRIPTION OF THE DRAWINGS

Embodiments may be described in detail with reference to the accompanying drawings, in which.

DESCRIPTION OF THE PREFERRED EMBODIMENTS

Embodiment of the present invention will be described below with reference to the drawings.

(First Embodiment)

Figure 1A:
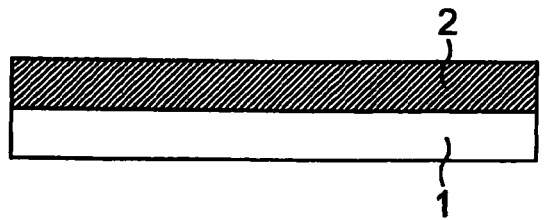
FIGS. 1A to 1F are sectional views for explaining the steps of a method for forming a pattern according to a first embodiment of the present invention.

FIGS. 1A to 1F are sectional views for explaining the steps of a method for forming a pattern according to the first embodiment. As shown in FIG. 1A, a resist 2 is applied onto a wafer substrate 1 with a film (not shown) formed thereon. The resist 2 is a positive type photoresist.

Figure 1B:
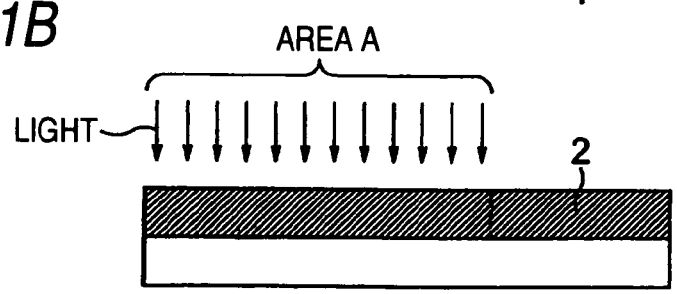

The wafer substrate 1 is irradiated with light, thereby exposing the resist 2 to light as shown in FIG. 1B. The area to be exposed to light is an area A, in which a desired fine pattern is to be formed to make a chip by the photo-nanoimprint technique in a later step. In this case, the exposure was performed by a KrF (krypton fluoride) scanner, which is a scanning-type aligner, using a photomask with its whole effective area opening.

Figure 1C:
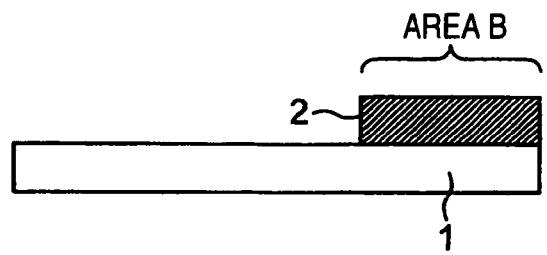

Then, the development of the wafer substrate 1 is performed, leaving only a part of the resist 2 on an area (wafer peripheral area) B, which has not undergone the exposure, as shown in FIG. 1C.

Figure 1D:
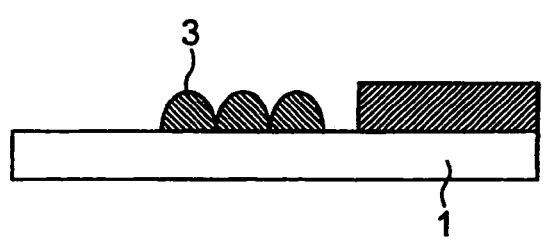

After that, a liquid photo-curable organic material 3 is applied onto the wafer substrate 1, as shown in FIG. 1D. The photo-curable organic material is acrylic monomer, for example.

Figure 1E:
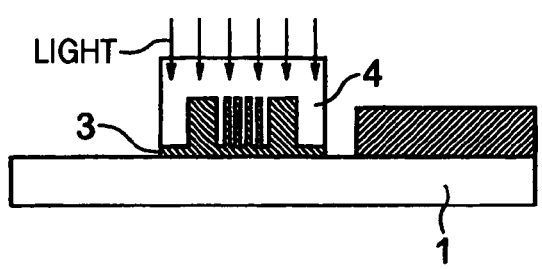

Next, a template 4 having the projection-and-reentrant pattern that correspond to the pattern to be formed on the wafer substrate 1 is brought into contact with the photo-curable organic material 3, as shown in FIG. 1E. Then, the liquid photo-curable organic material 3 is forced to flow expanding along the projection-and-reentrant pattern on the template 4 and fill the space inside the template. After that, the substrate thus prepared is subjected to irradiation with light, and then the photo-curable organic material 3 is cured. The light used for the irradiation may be any kind of light as long as it is capable of curing the photo-curable organic material 3, and for example, light emitted by a lamp may be used. The template 4 is formed from a material which allows the light to pass through it, e.g. quartz glass.

Figure 1F:
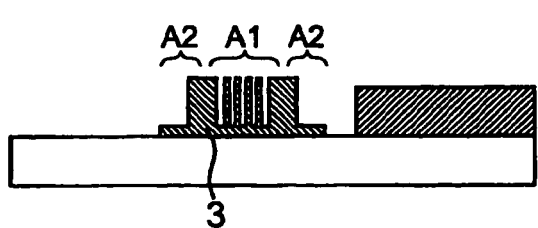

Subsequently, the template 4 is separated from the photo-curable organic material 3 as shown in FIG. 1F. At this point, the photo-curable organic material 3 has been cured, and therefore the material 3 is kept in the condition (i.e. shape) when it is in contact with the template 4. Here, a central portion of the photo-curable organic material 3 having a smaller pitch is termed a device chip-forming area A1, and an edge portion having a larger pitch is termed a chip peripheral area A2.

Figure 2:
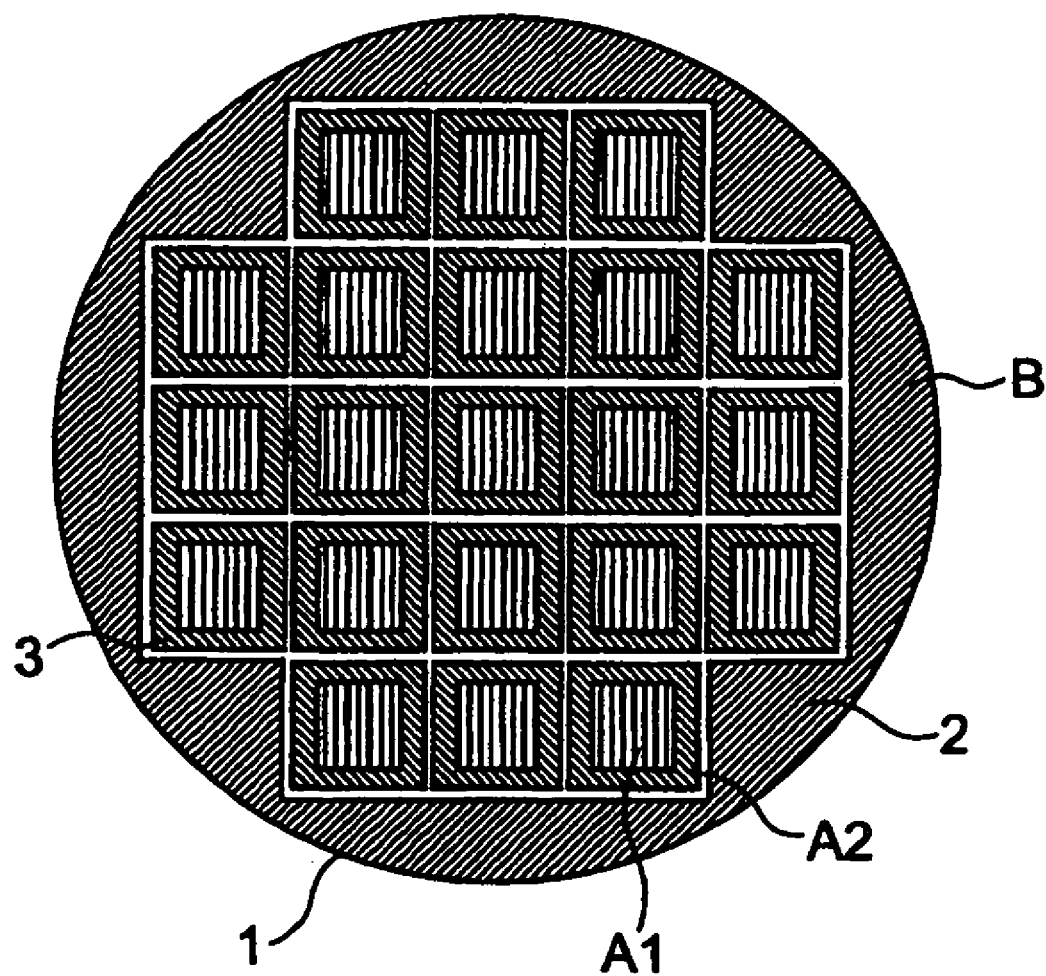
FIG. 2 is a top view of a wafer substrate formed by the method according to the first embodiment.

After that, the steps shown with reference to FIGS. 1D to 1F are repeated, thereby forming a layer of the photo-curable organic material 3 having a desired projection-and-reentrant pattern in two or more areas on the wafer substrate 1. The top view of the wafer substrate 1 thus formed is shown in FIG. 2. On the wafer peripheral area B, on which the pattern transfer by using of the template 4 has not been performed, the resist 2 still remains.

Subsequently, the resist pattern formed by using of the template 4, and the resist 2 is used as a mask to etch the film (not shown) on the wafer substrate 1. After that, a burying of a wire in a groove of the pattern formed by the etching, CMP and other processes are performed, whereby a device is formed.

As the resist 2 remains on the wafer peripheral area B, the difference in coverage of the wafer substrate 1 between the area (A1 and A2) to which the pattern is transferred by using of the template 4 and the wafer peripheral area (B) can be made smaller. Thus, the defects, such as the abnormality of a processing form arising the periphery of the pattern-forming area in the etching step, and the exfoliation of a wire in the step of CMP, can be prevented.

COMPARATIVE EXAMPLE

Figure 3A:
FIGS. 3A to 3D are sectional views for explaining the steps of a method for forming a pattern according to a comparative example.

FIGS. 3A to 3D are sectional views for explaining the steps of a method for forming a pattern according to a comparative example. As shown in FIG. 3A, a liquid photo-curable organic material 32 is applied onto a wafer substrate 31 with a film (not shown) formed thereon.

Figure 3B:
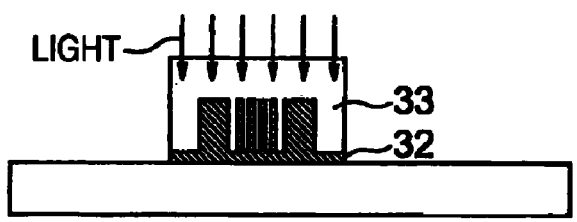

Next, a template 33 having the projection-and-reentrant pattern that corresponds to the pattern to be formed on the wafer substrate 31 is brought into contact with the photo-curable organic material 32, as shown in FIG. 3B. Then, the liquid photo-curable organic material 32 is forced to flow expanding along the projection-and-reentrant pattern on the template 33 and fill the space inside the template. After that, the substrate thus prepared is irradiated with light from above the template 33. The light used for the irradiation may be any kind of light as long as it is capable of curing the photo-curable organic material. The template 33 is formed from a material which allows the light to pass through it, e.g. quartz glass.

Figure 3C:
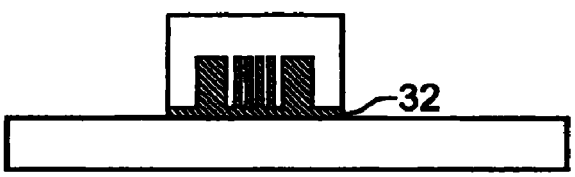

In this way the photo-curable organic material 32 is cured as shown in FIG. 3C.

Figure 3D:
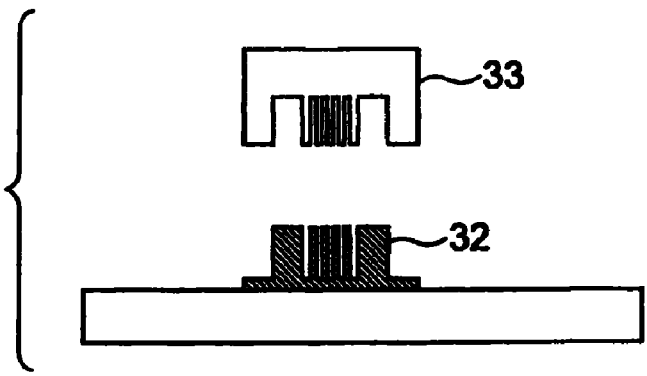

The template 33 is thereafter separated from the photo-curable organic material 32 as shown in FIG. 3D. At this point, the photo-curable organic material 32 has been cured, and therefore the material 32 is still kept in the condition (i.e. shape) when it was in contact with the template 33.

Figure 4A:
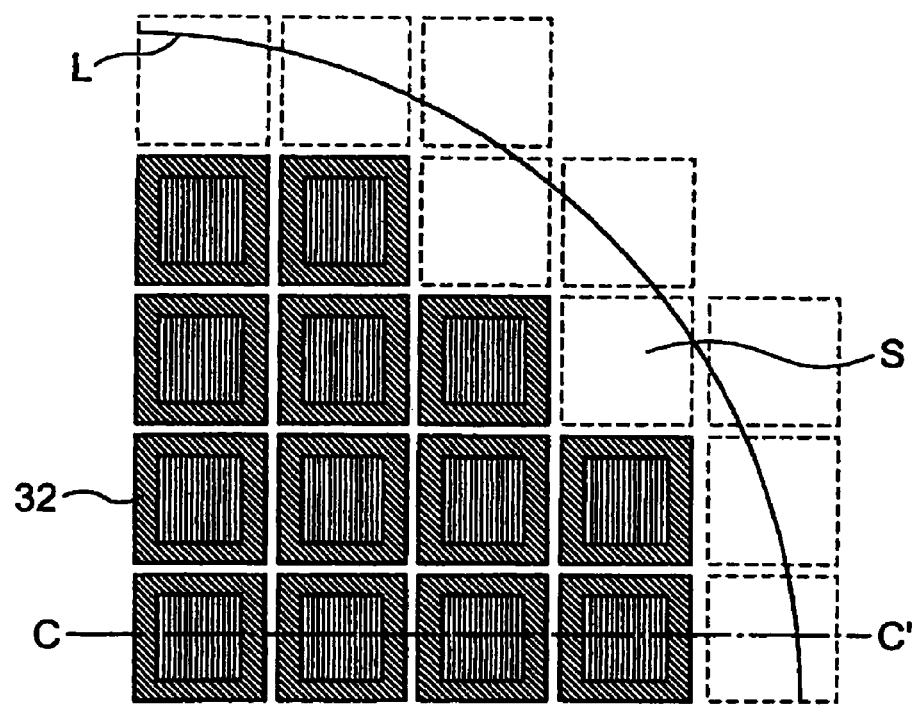
FIG. 4A is an illustration partly showing a top face of a wafer substrate formed by the method according to the comparative method.
Figure 4B:
FIG. 4B is an illustration partly showing a cross section of the wafer substrate.

After that, the steps shown with reference to FIGS. 3A to 3D are repeated, thereby forming a layer of the photo-curable organic material 32 having a desired projection-and-reentrant pattern in two or more areas on the wafer substrate 31. FIG. 4A shows a part of the top face of the resultant wafer substrate 31, and FIG. 4B shows a cross section taken along the line C-C' shown in FIG. 4A. The organic material is not put on an area on the substrate, which is not subjected to the pattern transfer by using of the template 33, i.e. an area where the template 33 overlaps with an edge L of the wafer substrate 31 (hereinafter referred to as "wafer peripheral area S").

Subsequently, the patterns thus formed by using of the template 33 are used as a mask to etch the film (not shown) on the wafer substrate 31. After that, a burying of a wire in a groove of the pattern formed by the etching, CMP and other processes are performed.

In this comparative example, the difference in the coverage of the wafer substrate 31 between the area to which the pattern is transferred by using of the template 33 and the wafer peripheral area S (having no pattern) is so large that the abnormality in a processing form such as a tapered shape of a groove of the pattern formed in the etching step can be caused. Further, the exfoliation of a wire can be caused in the step of CMP. If a device is formed on a substrate having such defect, a trouble such as the deterioration in electric property will come up.

In contrast, with the method for forming a pattern according to the embodiment, it is possible to reduce the difference in the coverage of the water substrate 1 between the area to which the pattern is transferred by using of the template 4 and the wafer peripheral area where the remaining resist 2 is used as a dummy pattern. Therefore, it is possible to prevent a defect concerning a pattern processing form and the like from being caused in the later etching step and the like. In addition, when a device is formed on a substrate with a pattern formed according to this method, good electrical properties can be achieved.

(Second Embodiment)

Figure 5A:
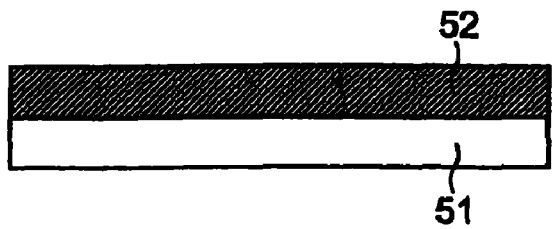
FIGS. 5A to 5G are sectional views for explaining the steps of a method for forming a pattern according to a second embodiment of the present invention.

FIGS. 5A to 5G are sectional views for explaining the steps of a method for forming a pattern according to the second embodiment. While in the first embodiment, the remaining resist having a coverage of 100% is used as a dummy pattern on the wafer peripheral area, in the second embodiment a dummy pattern having a desired aperture ratio is formed. As shown in FIG. 5A, a resist 52 is applied onto a wafer substrate 51 with a film (not shown) formed thereon. The resist 52 is a positive type photoresist.

Figure 5B:
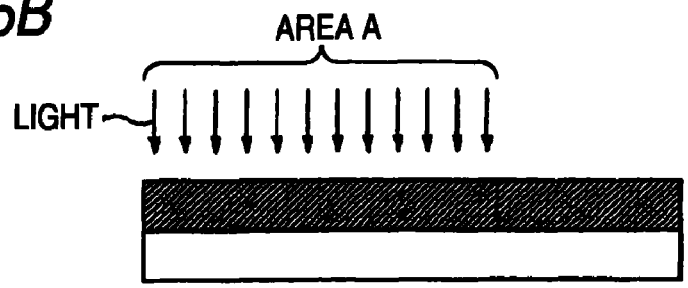

A 100%-opening mask (not shown) is used to expose an area (chip-forming area) A to light as shown in FIG. 5B, provided that on the chip-forming area A, a desired fine pattern is formed by the photo-nanoimprint technique to form a chip in a later step. Here, the exposure is performed using a KrF (krypton fluoride) scanner.

Figure 5C:
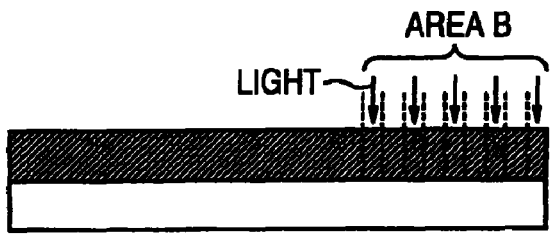

Then, as shown in FIG. 5C, a mask (not shown) having a dummy pattern for adjusting the coverage is used to perform exposure to light on an area B where formation of the desired fine pattern by the photo-nanoimprint technique in the later step is not performed. The area B is a wafer peripheral area of the wafer substrate 51, for example. The dummy pattern is determined based on the projection-and-reentrant pattern of a template 54 used in a later step of photo-nanoimprint. The aperture ratio of the dummy pattern is arranged to be equal to the percentage of projecting portions of the template 54 (corresponding to reentrant portions of the pattern transferred to the wafer substrate 51).

Figure 5D:
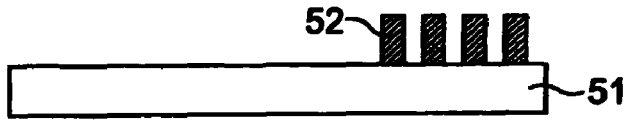

After that, the development of the wafer substrate 51 is performed, leaving a part of the resist 52 on the wafer peripheral area, which is to be used as a dummy pattern, as shown in FIG. 5D.

Figure 5E:

Subsequently, a liquid photo-curable organic material 53 is applied to a chip-forming area of the wafer substrate 51 as shown in FIG. 5E. The photo-curable organic material 53 is e.g. acrylic monomer.

Figure 5F:
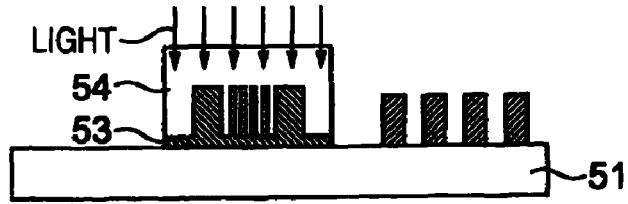

Next, a template 54 having the projection-and-reentrant pattern that corresponds to the pattern to be formed on the wafer substrate 51 is brought into contact with the photo-curable organic material 53, as shown in FIG. 5F. Then, the liquid photo-curable organic material 53 is forced to flow expanding along the projection-and-reentrant pattern on the template 54 and fill the space inside the template. After that, the substrate thus prepared is irradiated with light from above the template 54 to cure the photo-curable organic material 53. The light used for the irradiation may be any kind of light as long as it is capable of curing the photo-curable organic material 53, and for example, light emitted by a lamp may be used. The template 54 is formed from a material which allows the light to pass through it, e.g. quartz glass.

Figure 5G:
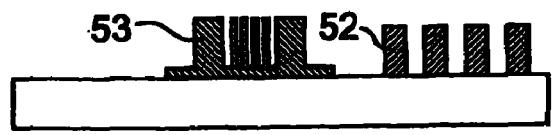

The template 54 is thereafter separated from the photo-curable organic material 53 as shown in FIG. 5G. At this point, the photo-curable organic material 53 has been cured, and therefore the material 53 is still kept in the condition (i.e. shape) when it was in contact with the template 54.

Figure 6A:
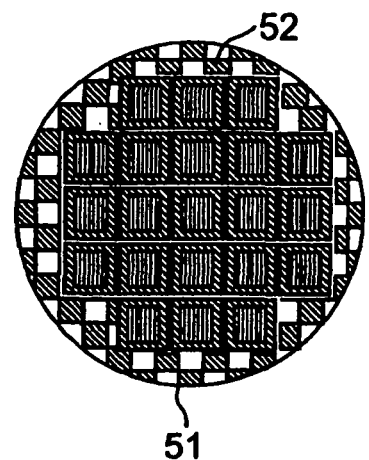
FIGS. 6A to 6C are top views of wafer substrates formed by the method according to the second embodiment.
Figure 6B:
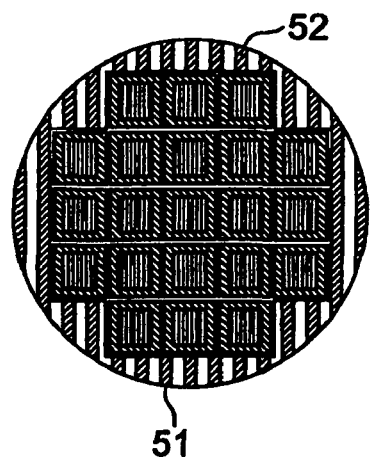
Figure 6C:
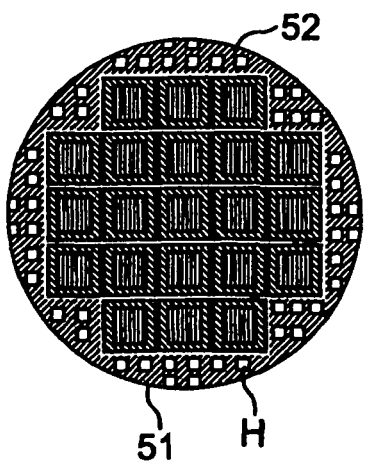

After that, the steps shown with reference to FIGS. 5E to 5G are repeated, thereby forming a layer of the photo-curable organic material 53 having a desired projection-and-reentrant pattern in two or more areas on the wafer substrate 51. FIGS. 6A to 6C each present a top view of the wafer substrate 51 which can be formed in this process. As shown in the drawings, on each wafer peripheral area, on which the pattern transfer by using of the template 54 has not been performed, the resist 52 shaped into a dummy pattern still remains.

Subsequently, a combination of the pattern 53 formed by using of the template 54, and the resist 52 shaped into a dummy pattern is used as a mask to etch the wafer substrate 51. After that, a burying of a wire in a groove of the pattern formed by the etching, CMP and other processes are performed, whereby a device is formed.

The dummy pattern suffices as long as the aperture ratio of the dummy pattern is equal to the percentage of projecting portions of the template 54 (corresponding to reentrant portions of the pattern transferred to the wafer substrate 51). Examples of a dummy pattern having an aperture ratio of 50% include a checkered pattern as shown in FIG. 6A, and a stripe pattern as shown in FIG. 6B. Also, the dummy pattern may be a pattern having two or more holes H as shown in FIG. 6C.

As the resist 52 remains in the form of a dummy pattern on the wafer peripheral area (Area B), the area to which the pattern is transferred by using of the template 54 and the wafer peripheral area are arranged to have a pattern aperture ratio common to them. As a result, the difference in coverage of the wafer substrate 51 between these areas can be reduced remarkably, and therefore the defects including the abnormality of a processing form arising in the etching step, and the exfoliation of a wire in the step of CMP can be prevented more efficiently.

The resist 52 may be negative type one. An example of using a negative type resist as the resist 52 will be described with reference to FIGS. 7A to 7C as a variant of the embodiment.

Figure 7A:
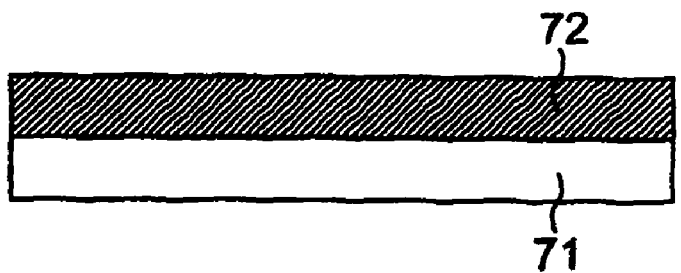
FIGS. 7A to 7C are sectional views for explaining a method for forming a pattern according to a variant of the embodiment.

As shown in FIG. 7A, a negative type resist 72 is applied onto a wafer substrate 71 with a film (not shown) formed thereon.

Figure 7B:
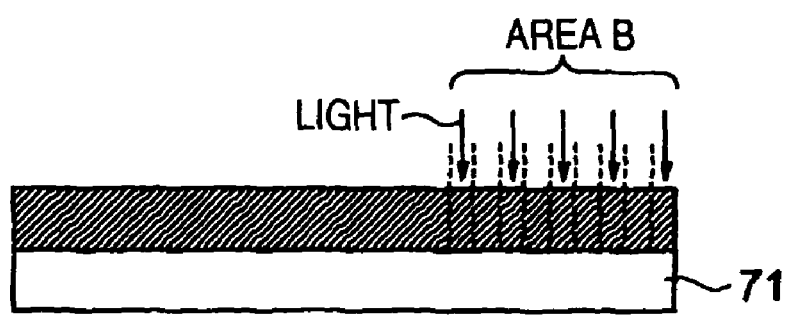

Then, as shown in FIG. 7B, a mask (not shown) having a dummy pattern for adjusting the coverage is used to perform exposure to light on an area B where formation of the desired fine pattern by the photo-nanoimprint technique in the later step is not performed. The area B is a peripheral area of the wafer substrate 71, for example. The dummy pattern is determined based on the projection-and-reentrant pattern of a template used in the later photo-nanoimprint step.

Figure 7C:
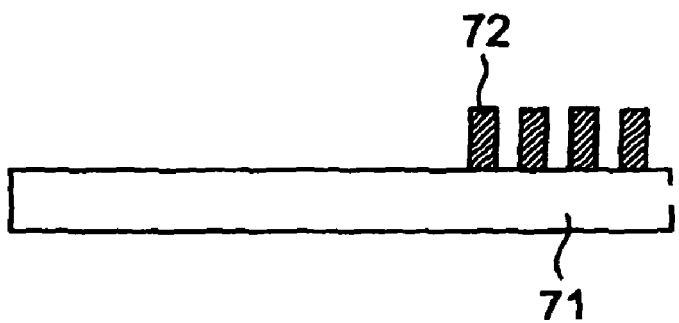

Then, the development of the wafer substrate 71 is performed, leaving only a part of the resist 72 on an area, which has undergone the exposure, as shown in FIG. 7C. The later steps are the same as the steps which have been described with reference to FIGS. 5E to 5G, and the their descriptions are omitted here.

In the case of using a positive type photoresist, two photomasks are needed to partly leave the resist 52 according to a dummy pattern on the wafer substrate 51 as shown FIGS. 5B and 5C. However using a negative type resist can decrease the number of photomasks used to partly leave the resist on the wafer substrate according to a dummy pattern to one as shown in FIGS. 7B and 7C, whereby the cost can be reduced.

(Third Embodiment)

Figure 8A:
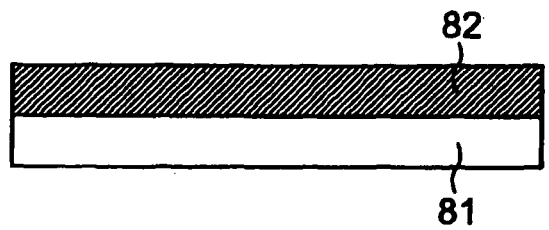
FIGS. 8A to 8F are sectional views for explaining the steps of a method for forming a pattern according to a third embodiment of the present invention.

FIGS. 8A to 8F are sectional views for explaining the steps of a method for forming a pattern according to the third embodiment. As shown in FIG. 8A, a resist 82 is applied onto a wafer substrate 81 with a machining-target film (not shown) formed thereon. The resist 82 is a positive type photoresist.

Figure 8B:
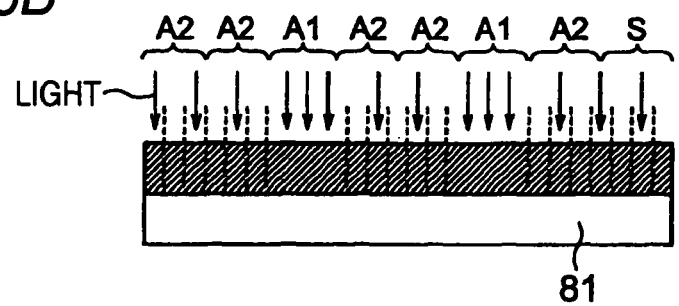

Exposure to light on a wafer substrate is performed using a mask (not shown) having; an opening in a place corresponding to a device chip-forming area A1, on which a desired fine pattern is formed by the photo-nanoimprint technique in a later step; a peripheral device pattern in a place corresponding to a chip peripheral area A2; and a dummy pattern in a place corresponding to a wafer peripheral area S as shown in FIG. 8B. Here, the exposure is performed using a KrF (krypton fluoride) scanner. The dummy pattern is determined based on the projection-and-reentrant pattern of a template 84 used in the later photo-nanoimprint step, and the peripheral device pattern. The aperture ratio of the dummy pattern is arranged based on the percentage of projecting portions of the template 84 (corresponding to reentrant portions of the pattern transferred to the wafer substrate 81), and the aperture ratio of the peripheral device pattern so that the chip-forming area (A1 and A2) and the wafer peripheral area (S) are identical to each other in the percentage of exposed portions of the wafer substrate 81.

Figure 8C:
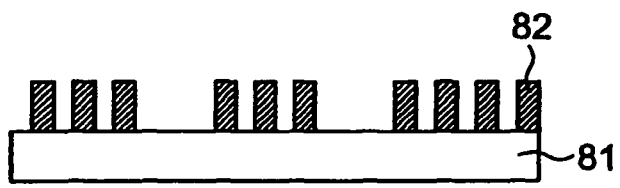

Then, the development of the wafer substrate 81 is performed, leaving only a part of the resist 82 on an area, which has not undergone the exposure, as shown in FIG. 8C. The remaining resist 82 is used to form a dummy pattern.

Figure 8D:
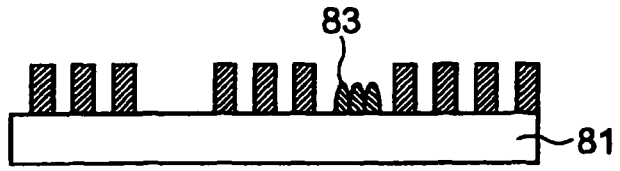

Subsequently, a liquid photo-curable organic material 83 is applied onto the wafer substrate 81 as shown in FIG. 8D. The photo-curable organic material is e.g. acrylic monomer.

Figure 8E:
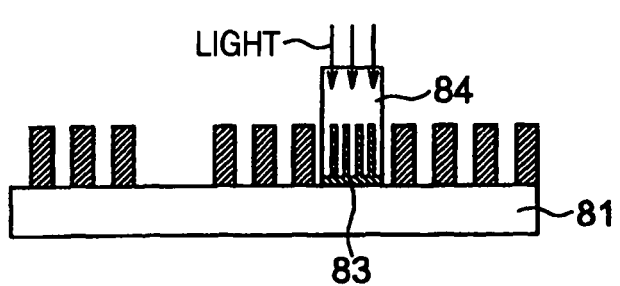

Next, a template 84 having the projection-and-reentrant pattern that corresponds to the pattern to be formed on the wafer substrate 81 is brought into contact with the liquid photo-curable organic material 83, as shown in FIG. 8E.

Then, the liquid photo-curable organic material 83 is forced to flow expanding along the projection-and-reentrant pattern on the template 84 and fill the space inside the template. After that, the substrate thus prepared is irradiated with light from above the template 84 to cure the photo-curable organic material 83. The light used for the irradiation may be any kind of light as long as it is capable of curing the photo-curable organic material 83, and for example, light emitted by a lamp may be used. The template 84 is formed from a material which allows the light to pass through it, e.g. quartz glass.

Figure 8F:
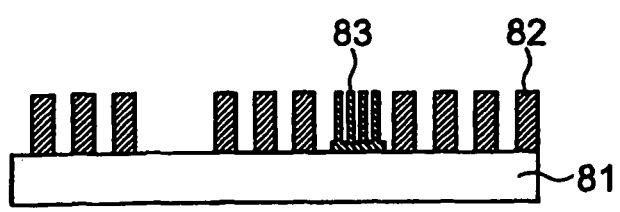

The template 84 is thereafter separated from the photo-curable organic material 83 as shown in FIG. 8F. The photo-curable organic material 83 has been cured, and therefore the material 83 is still kept in the condition (i.e. shape) when it was in contact with the template 84.

After that, the steps shown with reference to FIGS. 8D to 8F are repeated, thereby forming a layer of the photo-curable organic material 83 having a desired projection-and-reentrant pattern in two or more areas on the wafer substrate 81.

Figure 9:
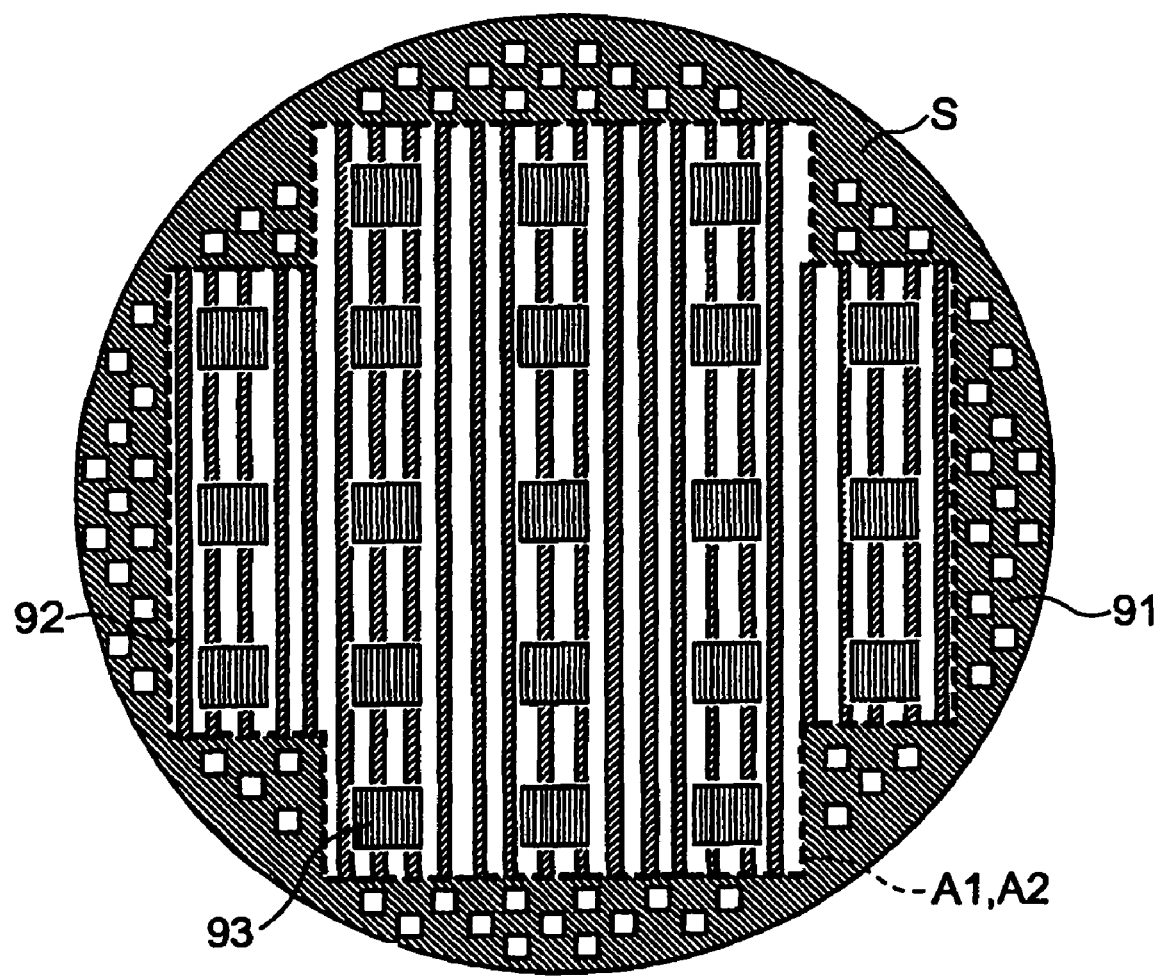
FIG. 9 is a top view of a wafer substrate formed by the method according to the third embodiment.

The top view of an example of the wafer substrate 81 which can be formed in this process is presented by FIG. 9. As shown in the drawings, on the wafer peripheral area S, the resist 91 shaped into a dummy pattern (having two or more holes) remains; on the chip-forming area (A1 and A2), the resist 92 shaped in a peripheral device pattern and the photo-curable organic material 93 having forms of projections shaped by using of the template 84 are arranged.

Subsequently, a combination of the pattern 83 formed by using of the template 84, and the remaining resist 82 is used as a mask to etch the wafer substrate 81. After that, a burying of a wire in a groove of the pattern formed by the etching, CMP and other processes are performed, whereby a device is formed.

As the resist 82 remains in the form of a dummy pattern on the wafer peripheral area, the difference in coverage of the wafer substrate 81 between the chip-forming area and wafer peripheral area can be reduced remarkably, and therefore the defects including the abnormality of a processing form arising in the etching step, and the exfoliation of a wire in the step of CMP can be prevented efficiently.

The method for forming a pattern according to this embodiment is suitable for pattern formation by using of a combination of the photo-nanoimprint and photolithography such that only a resist pattern for an area with a narrow pitch (line/space) like a device chip-forming area is formed by using of a template according to the photo-nanoimprint technique, and a pattern for an area whose pitch is not narrow like a chip peripheral area, and a pattern for a wafer peripheral area are formed by the publicly known photolithography technique.

According to this method, the size of a template can be made smaller, and therefore the cost required to fabricate the template can be reduced.

The above-described embodiments are each just an example, and should not be regarded as imposing restrictions on the present invention. While in the above embodiments a resist designed for KrF exposure is adopted as the resist to be put on a wafer substrate, other resists which are sensitive to other kinds of light including EB (Electron Beam) and EUV (Extreme Ultraviolet Radiation) may be used instead. The technical field of the present invention is specified by the Claims hereof, and it is intended that any changes and modifications in the sense of being on a parity with the Claims and within the scope thereof are included herein.

What is claimed is:

1. A method for forming a pattern comprising:
applying a photosensitive resin onto a film on a wafer substrate;
partly exposing the photosensitive resin to light and developing the photosensitive resin to form a first pattern having an opening portion, the first pattern covering at least a portion of the film on an edge of the wafer substrate;
applying a photo-curable material onto the film exposed by the opening portion of the first pattern;
bringing one face of an optically-transmissive template having a second pattern formed on the one face into contact with the photo-curable material, the second pattern including projections and reentrants;
irradiating the photo-curable material with light; and
separating the template from the photo-curable material.

2. The method according to claim 1,
wherein the first pattern includes a dummy pattern area having an aperture ratio corresponding to a percentage of the projections and the reentrants of the second pattern.

3. The method according to claim 1,
wherein the second pattern includes:
a high density part in which the projections and reentrants are densely provided; and
a low density part in which the projections and reentrants are sparsely provided; and
wherein the first pattern includes:
a peripheral device pattern area corresponding to the low density part in the second pattern; and
a dummy pattern area corresponding to the high density part in the second pattern, thereby relaxing a difference in aperture ratios between the first pattern and the second pattern.

4. The method according to claim 1,
wherein the photosensitive resin includes a negative type resist.

5. A method for manufacturing a semiconductor device comprising:
applying a photosensitive resin onto a film on a wafer substrate;
partly exposing the photosensitive resin to light and developing the photosensitive resin to form a first pattern having an opening portion, the first pattern covering at least a portion of the film on an edge of the wafer substrate;
applying a photo-curable material onto the film exposed by the opening portion of the first pattern;
bringing one face of an optically-transmissive template having a projection-and-reentrant pattern formed on the one face into contact with the photo-curable material, thereby forming a second pattern;
irradiating the photo-curable material of the second pattern with light;
separating the template from the photo-curable material of the second pattern;
etching the film by using a combination of the photosensitive resin of the first pattern and the photo-curable material of the second pattern as a mask;
burying a wire in a groove formed by the pattern of the etching of the first pattern and the second pattern; and
forming a device pattern corresponding to the second pattern on the wafer substrate.

* * * * *